(12) United States Patent  (10) Patent No.: US 7,393,172 B1
Saeki et al.  (45) Date of Patent: Jul. 1, 2008

(54) UNTREATED BODY TRANSFER DEVICE AND SEMICONDUCTOR MANUFACTURING DEVICE WITH THE UNTREATED BODY TRANSFER DEVICE

(75) Inventors: Hiroaki Saeki, Shirane-Machi (JP); Masaki Narushima, Gilbert, AZ (US); Tetsu Osawa, Sagamihara (JP); Yasushi Taniyama, Toyohashi (JP); Shuuji Hagiwara, Toyohashi (JP)

(73) Assignee: Tokyo Electron Limited, Tokyo-To (JP)

( * ) Notice: Subject to any disclaimer, the term of this patent is extended or adjusted under 35 U.S.C. 154(b) by 615 days.

(21) Appl. No.: 10/048,012

(22) PCT Filed: Jul. 26, 2000

(86) PCT No.: PCT/JP00/04987

§ 371 (c)(1),
(2), (4) Date: Jan. 25, 2002

(87) PCT Pub. No.: WO01/08211

PCT Pub. Date: Feb. 1, 2001

(30) Foreign Application Priority Data

Jul. 26, 1999  (JP) .................................. 11/210017

(51) Int. Cl.
*H01L 21/677* (2006.01)

(52) U.S. Cl. .................................. 414/217.1; 414/937

(58) Field of Classification Search ................ 414/939, 414/217.1, 937
See application file for complete search history.

(56) References Cited

U.S. PATENT DOCUMENTS

| | | | | |
|---|---|---|---|---|
| 4,681,506 A | * | 7/1987 | Teramachi | ................ 198/468.9 |
| 4,900,939 A | * | 2/1990 | Aoyama | ...................... 250/548 |
| 4,904,153 A | * | 2/1990 | Iwasawa et al. | ............. 414/735 |
| 5,040,431 A | * | 8/1991 | Sakino et al. | ............ 74/490.09 |

(Continued)

FOREIGN PATENT DOCUMENTS

JP  9-23679  1/1997

(Continued)

OTHER PUBLICATIONS

PCT Notification of Transmittal of Copies of Translation of the International Preliminary Examination Report (PCT/IB/338) issued for PCT/JP00/04987.

(Continued)

*Primary Examiner*—Thomas J. Brahan
(74) *Attorney, Agent, or Firm*—Smith, Gambrell & Russell, LLP

(57) ABSTRACT

In a wafer transfer system wherein a wafer transfer robot linearly reciprocates by a linear motor, dust is prevented from adhering to a wafer.

A fixed base 9, on which the secondary side 11 of a linear motor M for linearly reciprocating a wafer transfer robot R is mounted, is mounted on the system body 1 of a wafer transfer system A in lateral directions and in vertical directions, so that dust dropping in accordance with the flow of clean air K from a clean air supply system 4 is directly sucked into an exhaust fan 5, which is provided on the bottom portion 1c of the system body 1, to be exhausted without being deposited on the top face of the fixed base 9 and the secondary side 11.

6 Claims, 8 Drawing Sheets

U.S. PATENT DOCUMENTS

| | | | | |
|---|---|---|---|---|
| 5,170,714 | A * | 12/1992 | Katagiri | 104/282 |
| 5,679,059 | A * | 10/1997 | Nishi et al. | 451/41 |
| 5,733,096 | A * | 3/1998 | Van Doren et al. | 414/744.3 |
| 5,773,951 | A * | 6/1998 | Markowski et al. | 318/625 |
| 5,833,426 | A | 11/1998 | Marohl | 414/217 |
| 5,844,662 | A * | 12/1998 | Akimoto et al. | 27/32 |
| 5,894,657 | A * | 4/1999 | Kanayama et al. | 29/740 |
| 5,933,902 | A * | 8/1999 | Frey | 15/102 |
| 5,950,773 | A * | 9/1999 | Ito | 188/67 |
| 6,203,582 | B1 * | 3/2001 | Berner et al. | 29/25.01 |
| 6,230,721 | B1 * | 5/2001 | Miyasako | 134/61 |
| 6,252,705 | B1 * | 6/2001 | Lo et al. | 359/393 |
| 6,257,827 | B1 * | 7/2001 | Hendrickson et al. | 414/805 |
| 6,293,855 | B1 * | 9/2001 | Yoshida et al. | 451/67 |
| 6,320,645 | B1 * | 11/2001 | Inoue et al. | 355/53 |
| 6,379,096 | B1 * | 4/2002 | Beutler et al. | 414/281 |
| 6,428,262 | B1 * | 8/2002 | Vanderpot et al. | 414/217 |
| 7,063,600 | B2 * | 6/2006 | Yoshida et al. | 451/67 |

FOREIGN PATENT DOCUMENTS

| | | | |
|---|---|---|---|
| JP | 10-214875 | | 8/1998 |
| WO | WO/98/19333 | * | 5/1998 |

OTHER PUBLICATIONS

International Preliminary Examination Report (PCT/IPEA/409) (translated) issued for PCT/JP00/04987.

* cited by examiner

UNTREATED BODY TRANSFER DEVICE AND SEMICONDUCTOR MANUFACTURING DEVICE WITH THE UNTREATED BODY TRANSFER DEVICE

TECHNICAL FIELD

The present invention relates generally to a processed-object transfer system for taking objects to be processed (wafers or the like), out of a processed-object carrier, which is provided in a load port unit, to transfer the objects to a system for processing the objects, and a semiconductor fabricating system with the transfer system.

BACKGROUND ART

As shown in FIG. 8, a wafer transfer system A' constituting a semiconductor fabricating system (not shown) is designed to take wafers U, one by one, out of a wafer carrier C, which is provided on the top face of a load port unit L, to transfer the wafers U to a wafer processing system E and to transfer the wafers U, which have been processed by the wafer processing system E, to the wafer carrier C again. At this time, if dust adheres to the wafers U, the wafers U can be defective. In order to prevent this, a clean air supply system 4 is provided in the upper portion of the wafer transfer system A' for always supplying clean air K from the unit 4 to the wafers U. This clean air K is blown from top to bottom of a wafer transfer robot R constituting the wafer transfer system A'. Dust existing in the wafer transfer system A' is carried toward the bottom by the flow of the clean air K, and exhausted by an exhaust fan 5 which is provided on the bottom portion 1c of a system body 1. Thus, dust is prevented from adhering to the wafers U.

In a conventional wafer transfer system, a ball screw and a control motor are used for linearly reciprocating a wafer transfer robot. Since the distance of the movement of the wafer transfer robot is not long in the case of the ball screw, a wafer transfer system for linearly reciprocating the wafer transfer robot by means of a linear motor has been developed.

Referring to FIG. 8, a wafer transfer system A' using a linear motor M will be described below. In a case where the linear motor M is used, the secondary side 11 of the motor M is usually mounted on the bottom portion 1c of the system body 1. However, in this case, the portion of the exhaust fan 5 is covered with the secondary side 11 of the linear motor M, so that there is a problem in that exhaust efficiency deteriorates. In addition, since the wide area of the secondary side 11 of the linear motor M faces upwards, dust is easy to be deposited on the top face of the secondary side 11, and this dust is sometimes carried by the flow of the clean air K to float. In such a case, dust is easy to adhere to the wafers U, so that the rate of occurrence of defective wafers U rises.

The load port unit L is mounted on the outside of the front wall of the system body 1, and the wafer carrier C is provided on the top face of the load port unit L. By mounting the linear motor M on the bottom portion 1c of the system body 1, the distance between the wafer transfer robot R, which is provided on the linear motor M, and the wafer carrier C is long, and a large number of members exist between the wafer carrier and the wafer transfer robot R. As a result, production errors in the members accumulate, so that there is a problem in that the wafer transfer robot R can not precisely position the wafers in the wafer carrier C.

In a system of this type, there are some cases where the wafer transfer robot R is emergency-stopped in view of safety work during the operator's maintenance and inspection work. In the case of the conventional wafer transfer system A', it is possible to emergency-stop the wafer transfer robot R with a relatively simple construction by incorporating an electromagnetic brake or the like in the control motor for driving the ball screw. However, in the case of the linear motor M, it is very difficult to incorporate the above described electromagnetic brake or the like.

Means for stopping the wafer transfer robot R using the linear motor M will be described below. In the control circuit for the linear motor M, a regenerative braking is incorporated. By operating the regenerative braking, the wafer transfer robot R can be stopped at a predetermined position. In this control circuit, an uninterruptive power supply is also incorporated. Therefore, if the wafer transfer robot R intends to travel due to inertia when the feeding of power is interrupted by an interruption of the power supply or the like, the feeding of power can continue for a set-up time which is set in the uninterruptive power supply. Then, the regenerative braking is operated within the set-up time to stop the wafer transfer robot R. However, there are some cases where the wafer transfer robot travels due to inertia so as not to be stopped even if the set-up time of the uninterruptive power supply elapses. There is the possibility that this malfunction may quite similarly occur even if an emergency stop switch for interrupting the feeding of power to the wafer transfer system A is operated in an emergency.

DISCLOSURE OF THE INVENTION

In view of the above described malfunction, it is an object of the present invention to prevent dust from adhering to an object to be processed, and to surely stop a processed-object transfer robot during an interruption of the power supply or in an emergency.

In order to accomplish the aforementioned object, according to a first aspect of the present invention, there is provided a processed-object transfer system for transferring an object to be processed, while taking the object out of a processed-object carrier which is provided on the top face of a load port unit, the processed-object transfer system comprising: a system body; a linear motor which is provided so as to extend in lateral directions of the system body; and a processed-object transfer robot which is mounted on a primary or secondary side of the linear motor and which is capable of linearly reciprocating in longitudinal directions of the linear motor, wherein the load port unit is mounted on the outside of a front wall of the system body, and the linear motor is mounted in vertical directions inside of the front wall of the system body.

According to a second aspect of the present invention, there is provided a processed-object transfer system for transferring an object to be processed, while taking the object out of a processed-object carrier which is provided on the top face of a load port unit, the processed-object transfer system comprising: a system body; a linear motor which is provided so as to extend in lateral directions of the system body; a processed-object transfer robot which is mounted on a primary or secondary side of the linear motor and which is capable of linearly reciprocating in longitudinal directions of the linear motor; and a braking device including: a movable body which is mounted on one of the primary and secondary sides of the linear motor, the movable body being absorbed by a magnetic attraction of a coil, which is included in the one of the primary and secondary sides, against a resilient restoring force of a compression spring acting in the opposite direction to the magnetic attraction; and a brake plate which is mounted on the other side of the primary and secondary sides of the linear motor so as to face the movable body, said brake plate being contacted pressingly with said movable body by interrupting the feeding of power to said coil.

According to the first aspect of the present invention, the primary or secondary side of the linear motor, which is provided inside of the front wall of the system body so as to extend in lateral directions, is mounted in vertical directions. Dust dropping in the system body is directly exhausted by the exhaust fan which is provided on the bottom portion. Since the narrow surface faces upwards, the amount of dust deposited on the top face of the primary or secondary side of the linear motor is very small. In addition, since the narrow surface faces upwards, the air flow in the system body hardly reaches the top face of the primary or secondary side, so that deposited dust does not float in the system. As a result, dust is prevented from adhering to the object to be processed, so that the object in the system body is always transferred in a clean state. In addition, the distance between the processed-object transfer robot provided on the linear motor and the processed-object carrier decreases, and the number of members provided between the wafer carrier and the processed-object transfer robot decreases, so that the processed-object transfer robot can precisely position the object in the processed-object carrier.

According to the second aspect of the present invention, the braking device is mounted on the processed-object transfer system. Therefore, when an interruption of the power supply occurs to interrupt the feeding of power to the processed-object transfer system, the magnetic attraction of the coil for causing the movable body, which is mounted on one of the primary and secondary sides of the linear motor, to be spaced from the brake plate provided on the other side is released. The movable body approaches the brake plate by the resilient restoring force of the compression spring to pressingly contact the brake plate. At this time, the traveling of the processed-object transfer robot is simultaneously stopped by friction force.

The above described pressing contact of the movable body to the brake plate is always carried out when the feeding of power to the coil is interrupted. Therefore, it is possible to surely stop the traveling of the processed-object transfer robot only by providing an emergency stop switch for interrupting the feeding of power to the coil and by operating the emergency stop switch in an emergency.

BEST MODE FOR CARRYING OUT THE INVENTION

Referring now to the accompanying drawings, the preferred embodiment of a processed-object transfer system according to the present invention will be described below in detail. In this embodiment, an object to be processed is a wafer, and the processed-object transfer system is a wafer transfer system. Furthermore, the object should not be limited to the wafer. For example, the object may be a glass substrate for use in a liquid crystal display.

Figure 1:
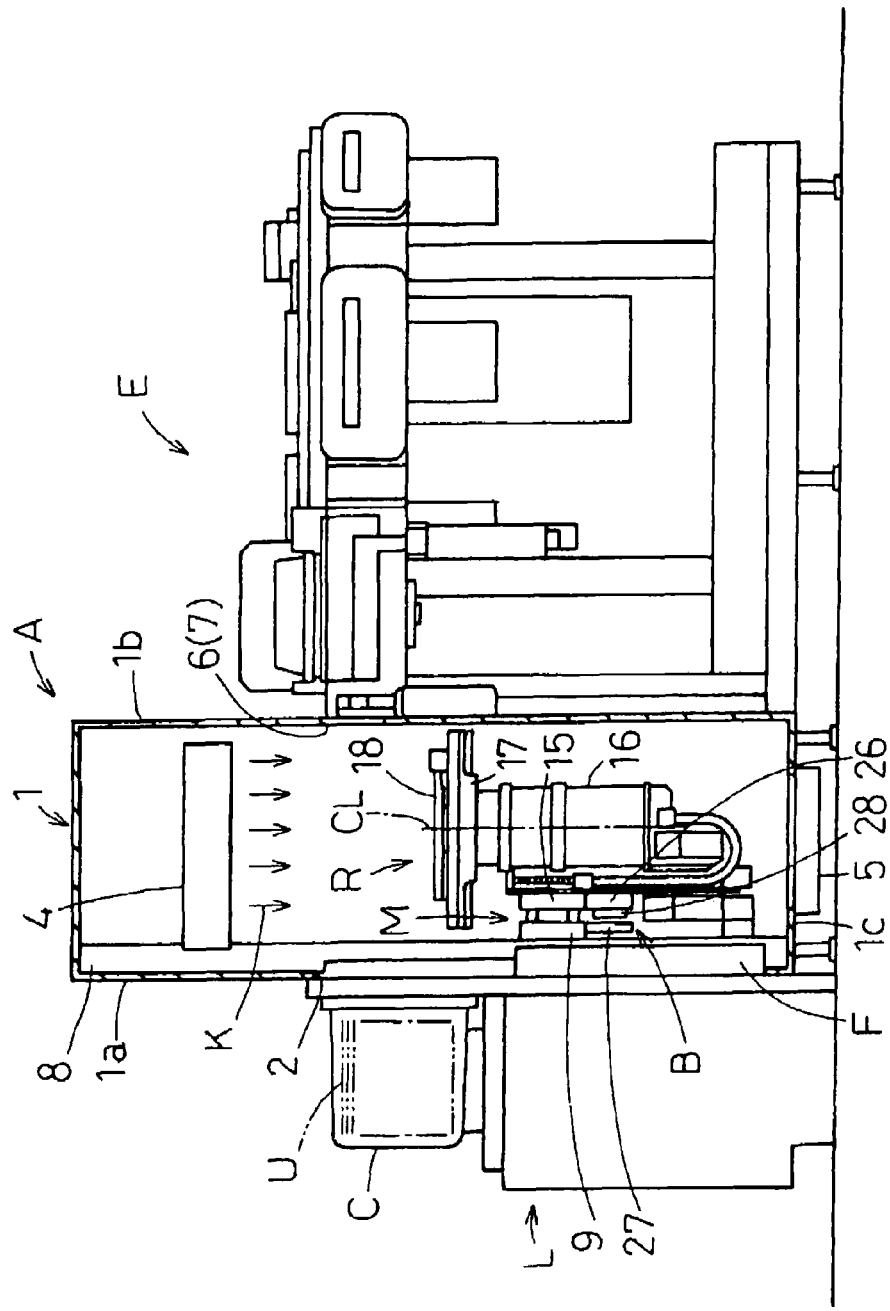
FIG. 1 is a lateral sectional view of a wafer transfer system A according to the present invention.
Figure 2:
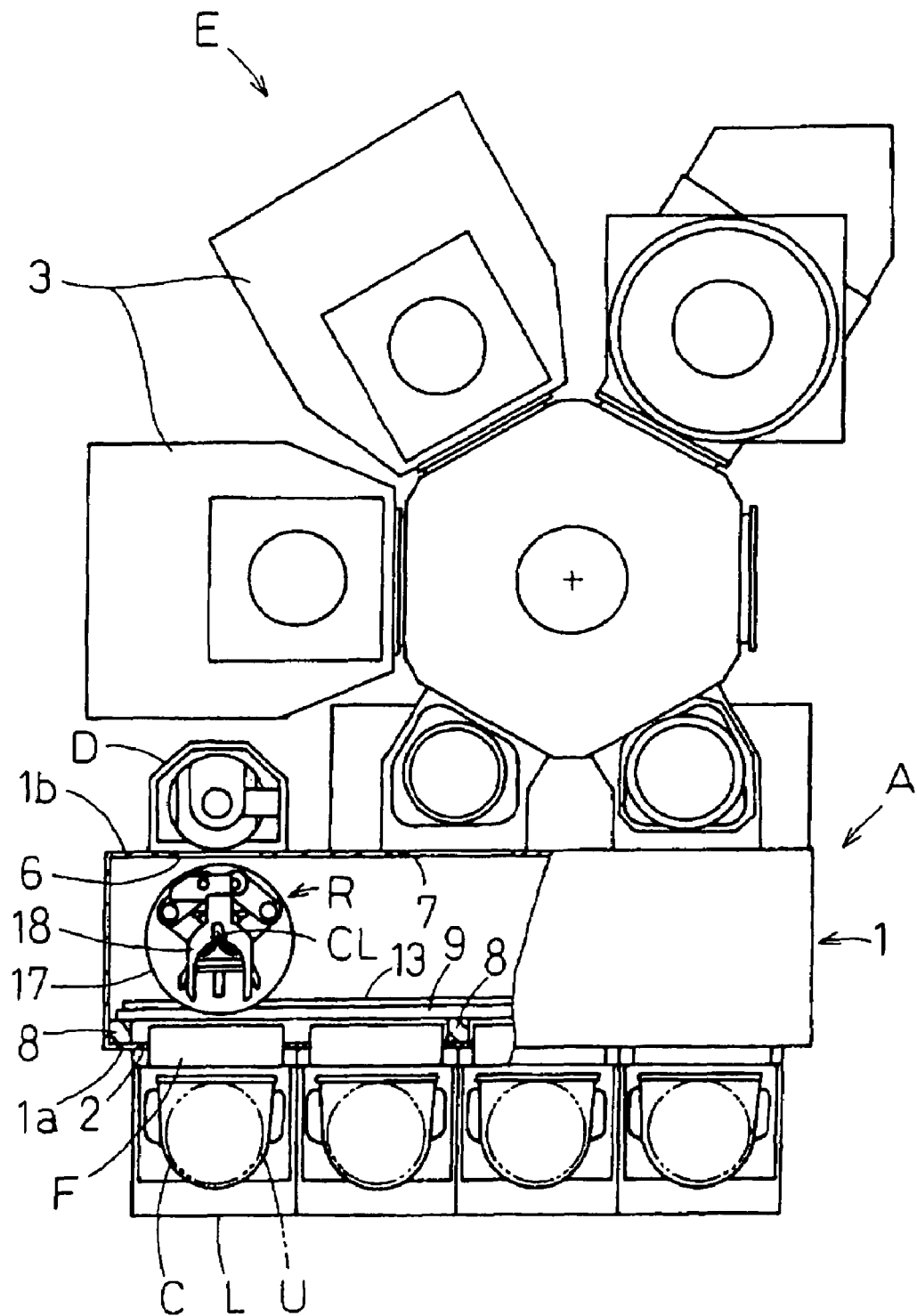
FIG. 2 is a partially broken-out plan view of the wafer transfer system A.
Figure 3:
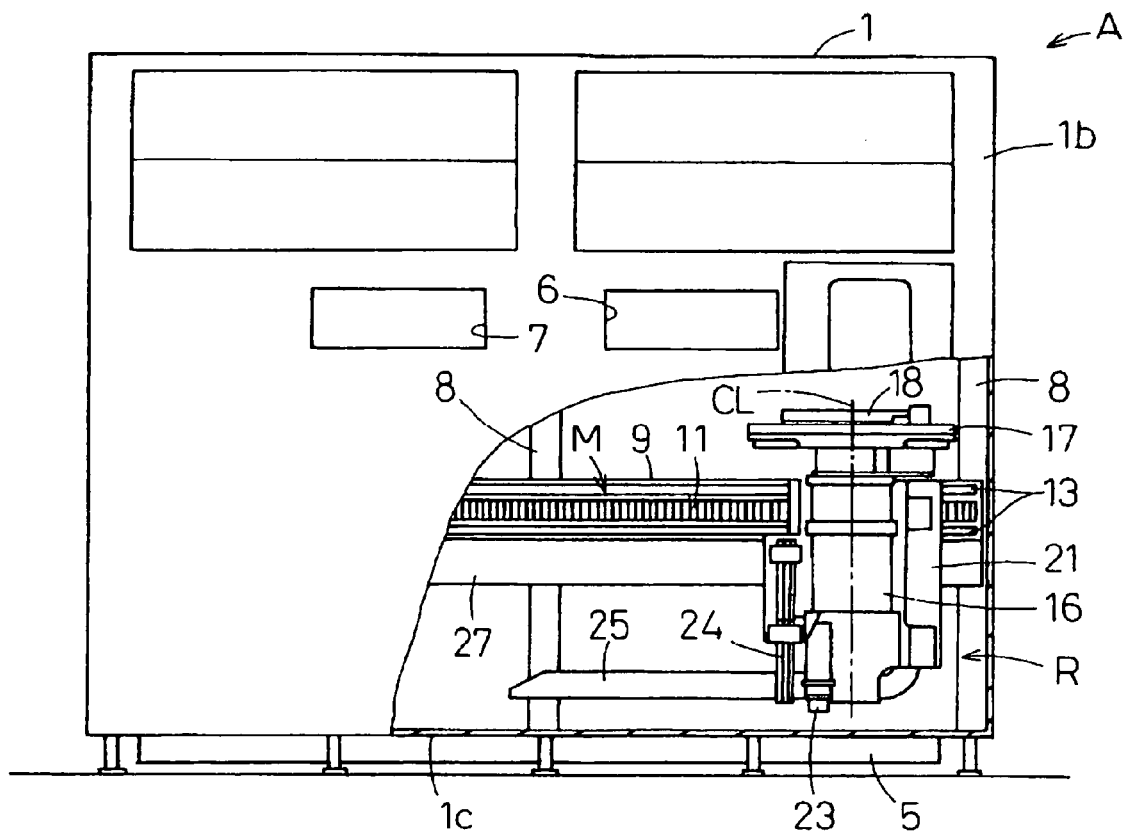
FIG. 3 is a partially broken-out rear view of the wafer transfer system A.
Figure 4:
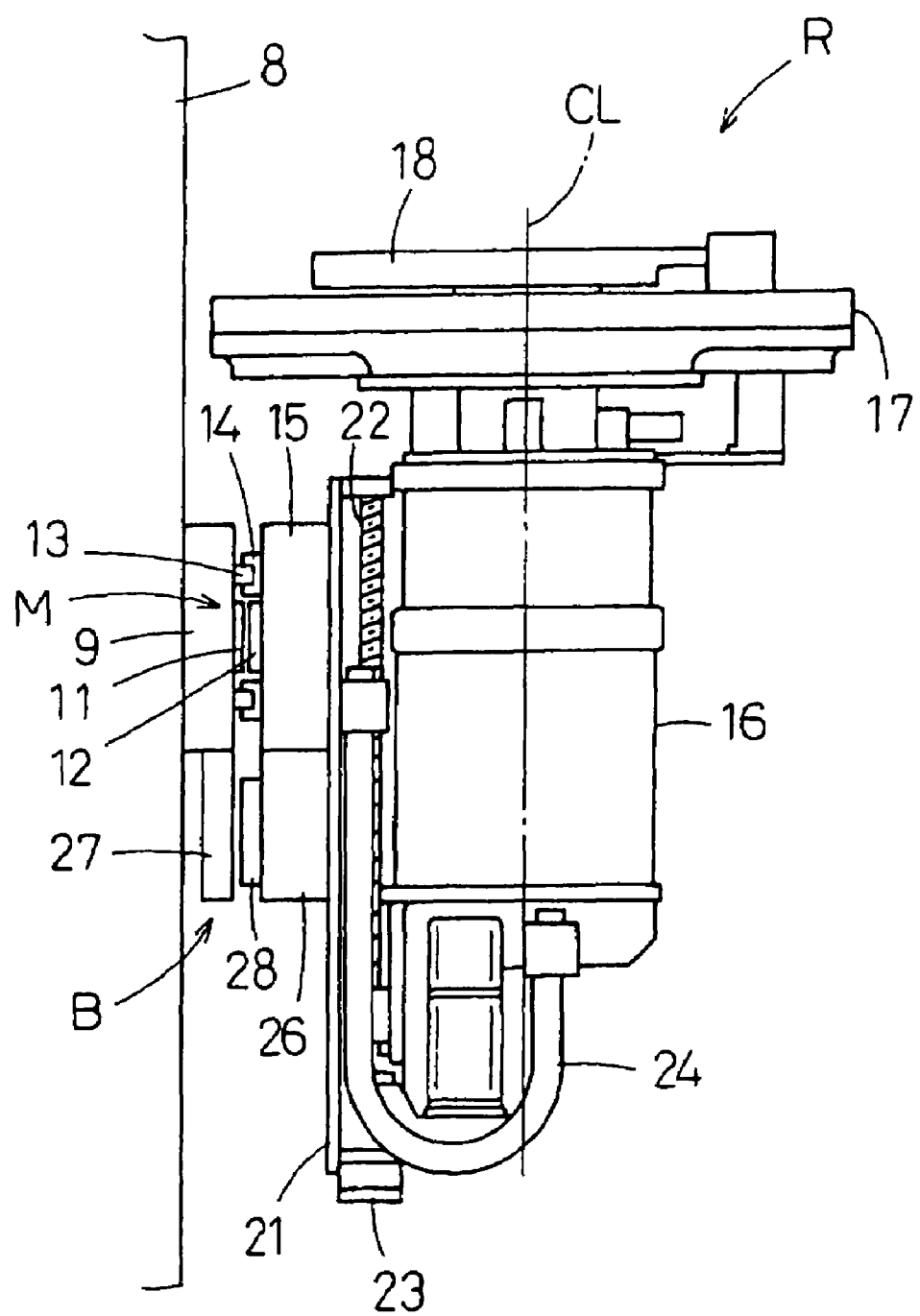
FIG. 4 is a side view of a wafer transfer robot R.

FIG. 1 is a lateral sectional view of a wafer transfer system A according to the present invention, and FIG. 2 is a partially broken-out plan view of the wafer transfer system A. FIG. 3 is a partially broken-out rear view of the wafer transfer system, and FIG. 4 is a side view of a wafer transfer robot R.

As shown in FIGS. 1 through 3, the front wall 1a of a box-shaped system body 1 constituting the wafer transfer system A according to the present invention has an opening 2 for mounting therein load port units L. In the opening 2, a plurality of (four in this embodiment) load port units L are mounted. On the top face of each of the load port units L, a wafer carrier C housing therein a plurality of wafers U is provided. On the back face of the front wall 1a, a lid attaching/detaching unit F for attaching/detaching a lid (not shown) of the wafer carrier C is mounted. On the back wall 1b of the system body 1, an orienter D for setting the direction (the crystallized direction in the crystal) of the wafer U and a wafer processing system E having wafer processing sections 3 for processing the wafers U are provided.

First, the wafer transfer system A will be described. In the system body 1 of the wafer transfer system A, there is provided a wafer transfer robot R for taking the wafers U out of the wafer carrier C, one by one, to transfer the wafers U to the wafer processing system E and to transfer the wafers U, which have been processed by the wafer processing system E, to the wafer carrier C again. In the upper portion of the system body 1, there is provided a clean air supply system 4 for supplying clean air K to the wafers U which have been taken out of the wafer carrier C. On the substantially whole bottom face 1c of the system body 1, an exhaust fan 5 is provided. On the back wall 1b of the system body 1, a first transfer window 6 and a second transfer window 7 are provided. The first transfer window 6 is a window for feeding the wafers U, which have been taken out of the wafer carrier C by the wafer transfer robot R, to an orienter D and for taking the aligned wafers U out of the orienter D by means of the wafer transfer robot R. The second transfer window 7 is a window for transferring the wafers U to the wafer processing system E by means of the wafer transfer robot R and for taking the processed wafers U out of the wafer processing system E.

Inside of the front wall 1a of the system body 1, struts 8 are provided so as to vertically extend in the substantially central portion and both end portion in lateral directions of the system body 1. On each of the struts 8, a flat fixed base 9 is mounted. The fixed base 9 is mounted so that the longitudinal directions of the fixed base 9 are coincident with the lateral directions (directions perpendicular to the plane of FIG. 1 or lateral directions in FIG. 2) of the system body 1 and so that the lateral directions (up and down directions in FIG. 1) of the fixed base 9 viewed from the side are coincident with the vertical directions of the system body 1 (in other words, the fixed base 9 is disposed vertically viewed from the side). On the substantially central portion of the fixed base 9 in vertical directions, the secondary side 11 of the linear motor M is mounted. The secondary side 11 is flat, and the length thereof is slightly shorter than the length of the system body 1 in lateral directions. The secondary side 11 of the linear motor M is mounted on the back face of the fixed base 9 (on the opposite side to the struts 8) so that the lateral directions (vertical directions in FIG. 4) of the secondary side 11 viewed from the side are coincident with the vertical directions of the system body 1. That is, similar to the fixed base 9, the secondary side 11 of the linear motor M is mounted so as to extend in vertical directions viewed from the side. In accordance therewith, the primary side 12 of the linear motor M also extends in vertical directions.

To the back face of the fixed base 9 above and below the secondary side 11 of the linear motor M, a pair of guide rails 13 are fixed so as to extend in lateral directions of the system body 1. On each of the pair of guide rails 13, a guide body 14 is mounted. On the back faces of the guide bodies 14 and primary side 12, a movable base 15 is mounted. On the back face of the movable base 15, the wafer transfer robot R is mounted. Therefore, the wafer transfer robot R can linearly reciprocate in lateral directions of the system body 1 by operating the linear motor M.

Figure 5:
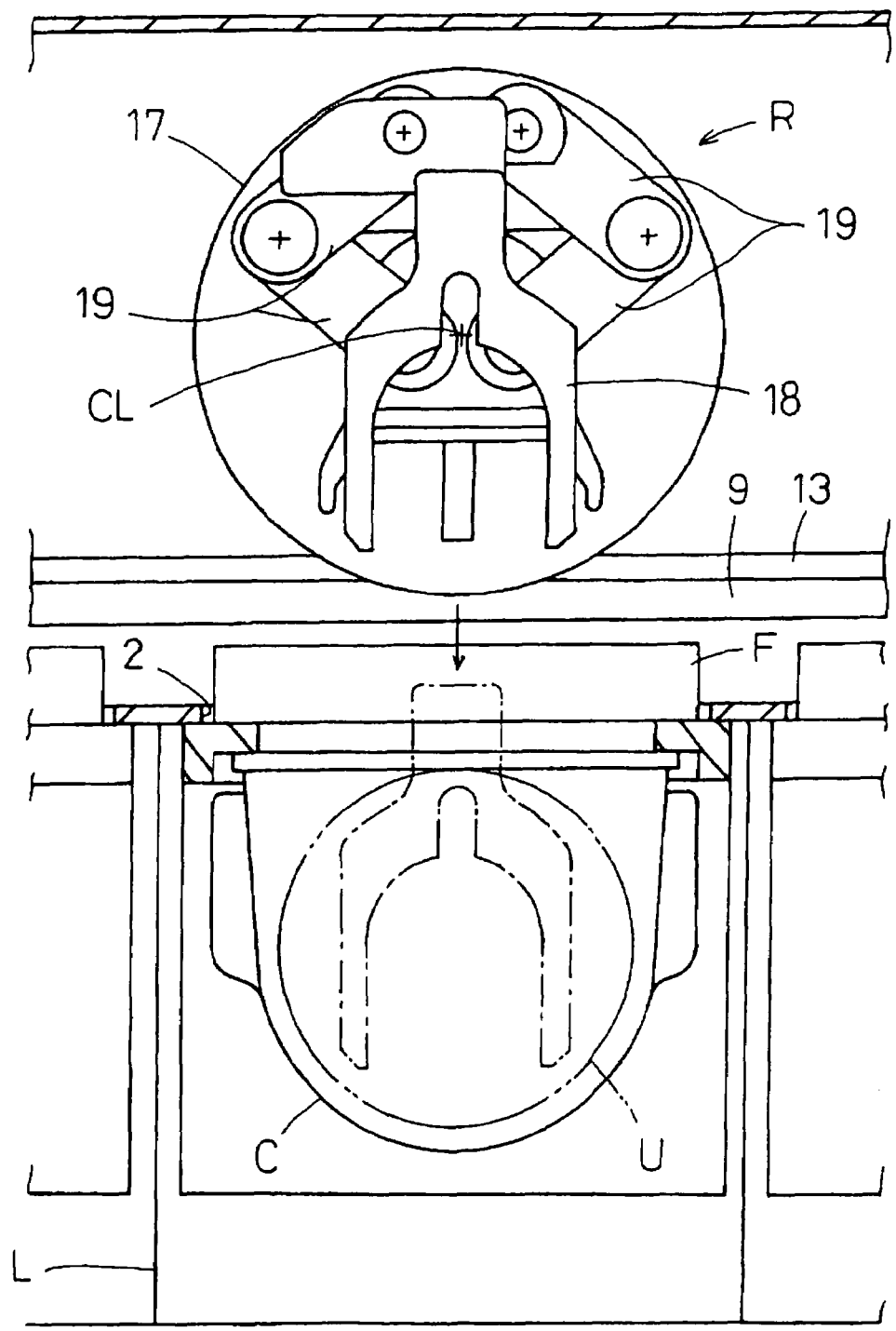
FIG. 5 is an illustration for explaining the operation of a wafer transferring fork 18 when the fork enters a wafer carrier C.

The wafer transfer robot R will be described below. As shown in FIGS. 4 and 5, the wafer transfer robot R comprises a robot body portion 16 which is mounted on the movable base 15, and a wafer handling portion 17 which is provided on the top of the robot body portion 16 and which is designed to enter the wafer carrier C to take the wafers U off. On the wafer handling portion 17, a wafer transferring fork 18 for transferring the wafers U is mounted. The wafer transferring fork 18 is retractable by a linkage comprising a plurality of link members 19. The wafer handling portion 17 is pivotable about the vertical axis CL of the robot body portion 16.

The movable base 15 is mounted on the robot body portion 16 via a base plate 21. On the base plate 21, a ball screw 22, a guide rail (not shown) and a control motor 23 are provided so as to extend vertical directions. By operating the control motor 23 to rotate the ball screw 22 in a predetermined direction, the robot body portion 16 can be vertically moved. In FIG. 3, reference numbers 24 and 25 denote wire housing members for housing therein wires for feeding power to the control motor 23.

Figure 6:
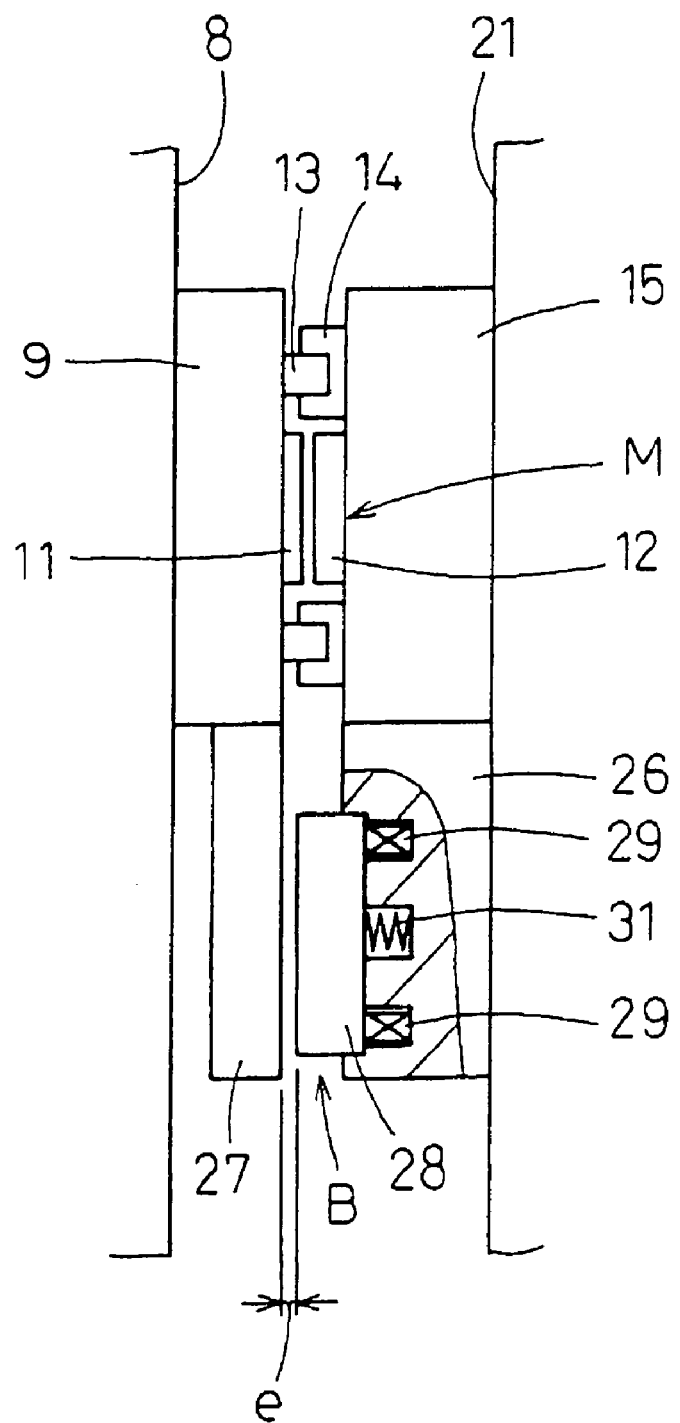
FIG. 6 is an enlarged side view of a braking device B.
Figure 7:
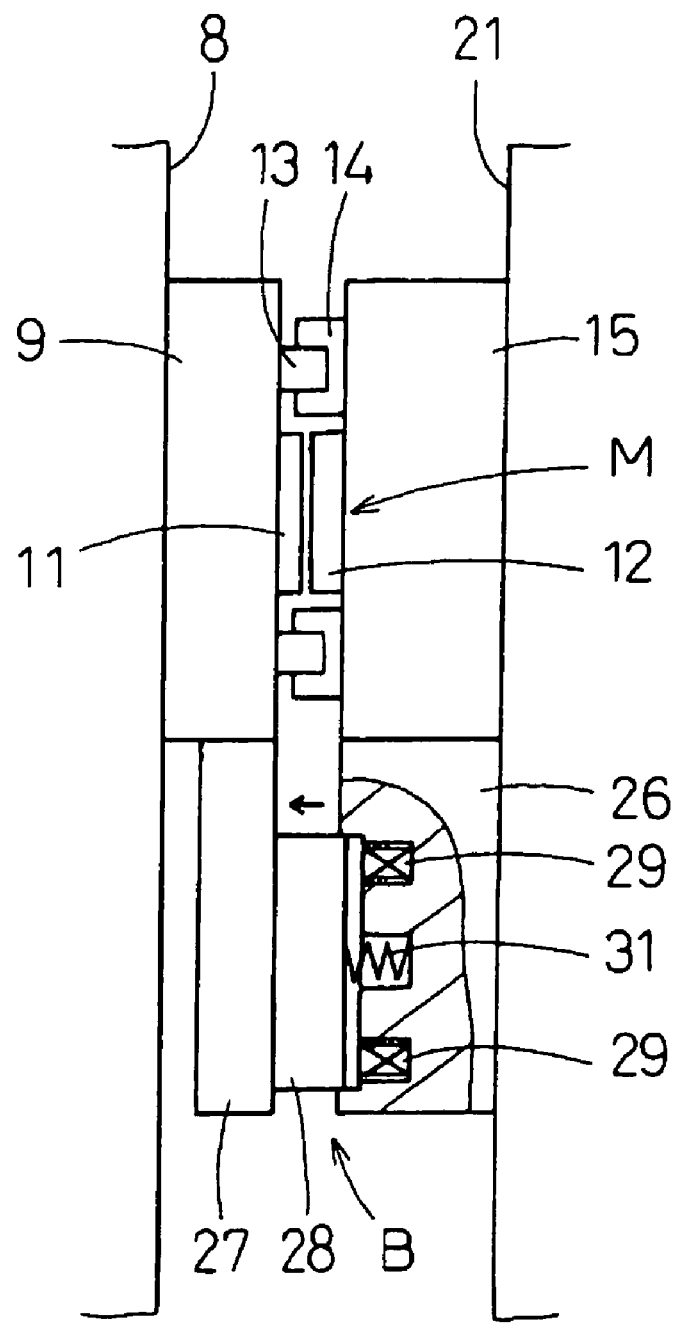
FIG. 7 is an illustration for explaining the operation of the braking device B.
Figure 8:
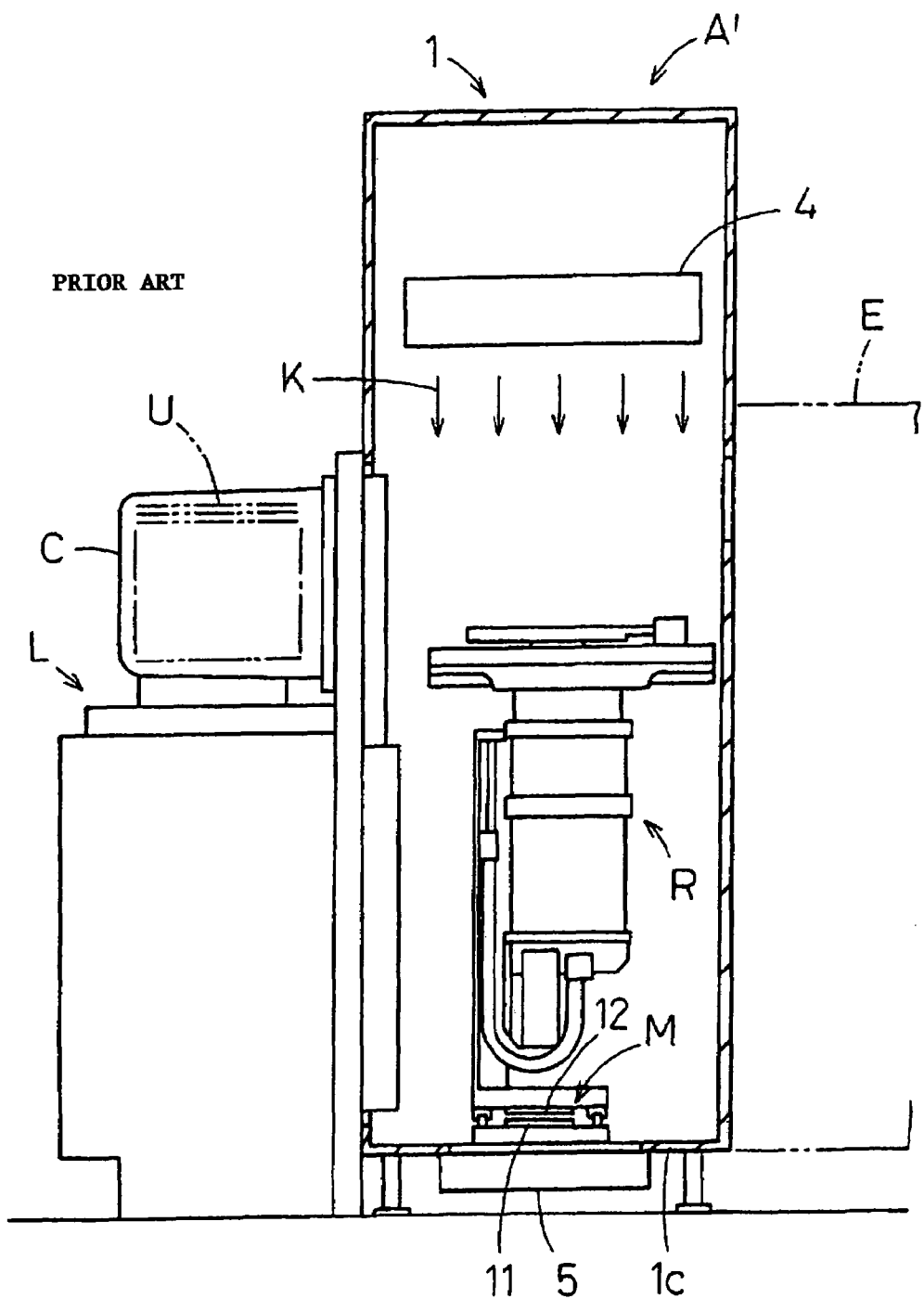
FIG. 8 is a lateral sectional view of a conventional wafer transfer system A'.

The braking device B provided in the wafer transfer system A will be described below. As shown in FIGS. 6 and 7, a movable body mounting portion 26 is provided on the bottom of the movable base 15 so as to extend therefrom, and a brake plate 27 facing the movable body mounting portion 26 is provided on the bottom of the fixed base 9 so as to extend therefrom. The brake plate 27 is made of, e.g., an aluminum plate, and extends substantially over the whole length of the fixed base 9. On the movable body mounting portion 26, a movable body 28 of iron is mounted. On the upper and lower portions of the back face of the movable body 28, two coils 29 are provided. On the substantially central portion of the back face of the movable body 28, a compression spring 31 is resiliently mounted. If power is fed to the two coils 29, magnetic attraction is generated, so that the movable body 28 is mounted by the magnetic attraction. This magnetic attraction acts in the opposite direction to the resilient restoring force of the compression spring 31, and is greater than the resilient restoring force. Therefore, when power is fed to the two coils 2, the movable body 28 is absorbed onto the two coils 29 against the resilient restoring force of the compression spring 31. At this time, a small gap e is formed between the brake plate 27 and the movable body 28, so that the wafer transfer robot R is linearly moved without any obstacles.

When the feeding of power to the two coils 29 is interrupted, the magnetic attraction of each of the coils 29 disappears. The movable body 28 is pushed out toward the brake plate 27 by the resilient restoring force of the compression spring 31 to pressingly contact the brake plate 27. As a result, friction force is generated between the brake plate 27 and the movable body 28, so that the traveling of the wafer transfer robot R is stopped. Since the above described pressing contact is carried out substantially simultaneously with the interruption of the feeding of power to the two coils 29, the traveling of the wafer transfer robot R is simultaneously stopped.

The operation of the wafer transfer system A according to the present invention will be described below. As shown in FIGS. 1 through 3, the wafer carrier C is mounted on the load port unit L which is provided on the front wall 1a of the system body 1. Subsequently, the lid (not shown) of the wafer carrier C is removed by the lid attaching/detaching unit F which is provided on the load port unit L. The wafer transfer robot R linearly moves in lateral directions of the system body 1, and vertically moves to a predetermined height to face the wafer carrier C. By means of the linkage comprising the plurality of link members 19, the wafer transferring fork 18 moves forwards to enter the wafer carrier C. This state is shown by a two-dot chain line in FIG. 5. A wafer U is supported on the wafer transferring fork 18, and then, the wafer transferring fork 18 is retracted, so that only one wafer U is taken out. Furthermore, a plurality of wafers may be simultaneously taken out by means of a multistage wafer transferring fork.

At this time, clean air K is always supplied downwards from the clean air supply system 4 which is provided in the system body 1. Therefore, clean air K is always supplied to the wafer U which has been taken out of the wafer carrier C by means of the wafer transferring fork 18, so that no dust adheres to the wafer U. In addition, dust floating in the system body 1 drops in accordance with the flow of the clean air K. Since the exhaust fun 5 is provided on the bottom portion 1c of the system body 1, the floating dust is directly sucked into the exhaust fan 5 to be exhausted. In the wafer transfer system A according to the present invention, the fixed base 9 and the secondary side 11 of the linear motor M are mounted in vertical directions. Therefore, the amount of the dust deposited on the top faces of the fixed base 9 and the secondary side 11 of the linear motor M is very small. In addition, the flow of the clean air K supplied from the clean air supply system hardly reaches the top faces of the fixed base 9 and the secondary side 11. As a result, the dust does not rise in the system body 1, so that the wafer U is always held in a clean state.

Then, while the wafer U is supported on the wafer transferring fork 18, the wafer handling portion 17 of the wafer transfer robot R rotates about the vertical axis CL of the robot body portion 16 to face the orienter D. The direction of the wafer U is defined by the orienter D. Subsequently, while the wafer U is supported on the wafer transferring fork 18, the wafer transfer robot R linearly moves in lateral directions of the system body 1 again and vertically moves to a predetermined height to face the second transfer window 7. The wafer U is transferred to the wafer processing section 3 of the wafer processing system E in which a predetermined process is carried out. The processed wafer U is mounted on the wafer transferring fork 18 of the wafer transfer robot R which has been previously moved to a position facing the second transfer window 7. The wafer transfer robot R linearly moves to cause the processed wafer U to be housed in the wafer carrier C at a predetermined position. By repeating the above described operation, all of the wafers U housed in the wafer carrier C are processed.

The operation of the braking device B will be described below. As shown in FIGS. 6 and 7, in a case where the traveling wafer transfer robot R is stopped at a predetermined position (e.g., a position facing the wafer carrier C for taking the wafer C off), i.e., in the case of a usual stopping, the wafer transfer robot R is stopped by operating a regenerative braking which is provided in a control circuit. A case where an interruption of the power supply occurs to interrupt the feeding of power to the wafer transfer system A will be described below. In the case of the wafer transfer system A in this preferred embodiment, an uninterruptive power supply is incorporated in a control circuit (not shown). Therefore, the uninterruptive power supply is operated substantially simultaneously with the interruption of the feeding of power to the wafer transfer system A, so that the feeding of power to the wafer transfer system A continues for the set-up time (e.g., 1 second) of the uninterruptive power supply. Within this set-up time, the regenerative braking is operated to stop the wafer transfer robot R. Even if the wafer transfer robot R intends to travel (inertia-travel) without being stopped within the set-up time due to any causes, if the set-up time of the uninterruptive power supply elapses, the feeding of power to the wafer transfer system A is interrupted. Simultaneously, the feeding of power to the respective coils 29 is also interrupted, so that the magnetic attraction for causing the movable body 28, which is mounted on the movable body mounting portion 26 extending from the movable base 15, to be spaced from the brake plate 27 extending from the fixed base 9 is released. The movable body 28 is pushed out toward the brake plate 27 by the resilient restoring force of the compression spring 31. At this time, friction force is generated between the brake plate 27 and the movable body 28, so that the traveling of the wafer transfer robot R is stopped. Thus, the inertia traveling of the wafer transfer robot R is prevented during an interruption of the power supply or the like, so that the wafer transfer system A is not damaged.

The above described pressing contact of the movable body 28 to the brake plate 27 is always carried out when the feeding of power to each of the coils 29 is interrupted. Therefore, the braking device B may be operated in an emergency. That is, an emergency stop switch (not shown) is provided in the system body 1 at a predetermined position (e.g., a manual operating panel) so that the feeding of power to each of the coils 29 is interrupted by operating the emergency stop switch without operating the uninterruptive power supply. If only the operator operates the emergency stop switch to interrupt the feeding of power to each of the coils 29 in an emergency, the movable body 28 pressingly contacts the brake plate 27. Thus, the traveling of the wafer transfer robot R can be simultaneously and surely stopped in an emergency. The construction of the braking device B is very simple, and the control thereof is also very simple.

In this preferred embodiment, the secondary side 11 of the linear motor M is mounted inside of the front wall 1a of the system body 1, and the primary side 12 is movable. However, the linear motor M may be reversely mounted in view of the structure of the linear motor M, i.e., the primary side 12 may be mounted inside of the front wall 1a of the system body 1, and the secondary side 11 may be movable. In this preferred embodiment, the linear motor M is mounted on the front wall 1a of the system body 1. However, the linear motor M may be mounted on the back wall 1b of the system body 1 although there is the above described problem on the precision of position.

As described above, according to the preferred embodiment of the present invention, the primary or secondary side of the linear motor M for linearly reciprocating the wafer transfer robot R is mounted so as to extend in lateral directions of the system body 1 and in vertical directions. Therefore, dust dropping in the system body is directly sucked into the exhaust fan 5 to be exhausted, so that the interior of the system can be always held in a clean state to prevent dust from adhering to the wafer U. As a result, the wafer U can be always held in a clean state without deteriorating the advantages of the linear motor M, so that it is possible to prevent defective wafers from being produced by dust. The distance between the wafer transfer robot R provided on the top of the linear motor M and the wafer carrier C decreases, and the number of members provided between the wafer carrier and the wafer transfer robot decreases, so that the wafer transfer robot R can precisely position the wafers in the wafer carrier C.

The linear motor M for linearly reciprocating the wafer transfer robot R is provided with the braking device for causing the movable body 28 to pressingly contact the brake plate 27 when the feeding of power to the wafer transfer system A is interrupted. Therefore, the traveling of the wafer transfer robot A can be surely stopped during an interruption of the power supply or in an emergency. The construction for causing the movable body 28 to pressingly contact the brake plate 27 comprises the coils 29 and the compression spring 31 which are very simple. The control thereof is also very simple since it is carried out only by interrupting the feeding of power to the coils 29. As a result, it is possible to prevent the inertia traveling of the wafer transfer robot R without deteriorating the advantages of the linear motor M.

If a semiconductor fabricating system is provided with a processing means, such as a deposition system, and the above described wafer transfer system A, it is possible to provide a semiconductor fabricating system capable of removing the influence of dust and surely stopping a processed-object transfer robot during an interruption of the power supply or in an emergency.

The invention claimed is:

1. A transfer system for transferring an object to be processed out of a carrier which is mounted on a top face of a load port unit and for transferring the object to the carrier, said transfer system comprising:
   a system body having a bottom, a front wall vertical with respect to the bottom, and a guide rail provided so as to extend in lateral directions of said system body;
   a linear motor having a secondary side provided so as to extend in lateral directions of said system body and a primary side movable to the secondary side; and
   a transfer robot which is mounted on the primary side of said linear motor and which is capable of linearly reciprocating along the guide rail,
   wherein both said load port unit and the guide rail are mounted on the front wall of said system body, said load port unit is mounted on the outside of the front wall of said system body, and the guide rail is mounted inside of said front wall of said system body,
   the primary side and the secondary side have vertical oriented opposing faces, and
   the transfer robot transfers the object from and to the carrier positioned on the top face of the load port unit.

2. A transfer system as set forth in claim 1, which further comprises an exhaust fan which is provided on the bottom of said system body.

3. A transfer system as set forth in claim 2, which further comprises a clean air supply system for supplying clean air to said object which is transferred by said transfer robot, said clean air supply system being provided in an upper portion of said system body.

4. A transfer system as set forth in claim 1, which further comprises a braking device including:
   a movable body which is mounted on one of the primary and secondary sides of said linear motor, said movable body being subject to a magnetic attraction of a coil, which is included in said one of the primary and secondary sides, against a resilient restoring force of a compression spring acting in the opposite direction to said magnetic attraction; and a brake plate which is mounted on the other side of the primary and secondary sides of said linear motor so as to face said movable body, said brake plate being contacted pressingly with said movable body by interrupting the feeding of power to said coil.

5. A transfer system as set forth in claim 4, wherein said system body is provided with an emergency stop switch for emergency-stopping a processed-object transfer robot, and the feeding of power to said coil is interrupted by operating said switch.

6. A semiconductor fabricating system comprising:

a transfer system for transferring an object to be processed out of a carrier which is mounted on a top face of a load port unit and for transferring the object to the carrier, said transfer system comprising:

a system body having a bottom, a front wall vertical with respect to the bottom, and a guide rail provided so as to extend in lateral directions of said system body;

a linear motor having a secondary side provided so as to extend in lateral directions of said system body and a primary side movable to the secondary side; and a transfer robot which is mounted on the primary side of said linear motor and which is capable of linearly reciprocating along the guide rail, wherein both said load port unit and the guide rail are mounted on the front wall of said system body, said load port unit is mounted on the outside of the front wall of said system body and the guide rail is mounted inside of said front wall of said system body, the primary side and the secondary side have vertical oriented opposing faces, and the transfer robot transfers the object from and to the carrier positioned on the top face of the load port unit, and a processing means for processing the object to be processed.

* * * * *